US010999678B2

(12) United States Patent
Suenaga et al.

(10) Patent No.: US 10,999,678 B2
(45) Date of Patent: May 4, 2021

(54) AUDIO SIGNAL PROCESSING DEVICE AND AUDIO SIGNAL PROCESSING SYSTEM

(71) Applicant: SHARP KABUSHIKI KAISHA, Sakai (JP)

(72) Inventors: Takeaki Suenaga, Sakai (JP); Hisao Hattori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/497,200

(22) PCT Filed: Dec. 28, 2017

(86) PCT No.: PCT/JP2017/047259
§ 371 (c)(1),
(2) Date: Sep. 24, 2019

(87) PCT Pub. No.: WO2018/173413
PCT Pub. Date: Sep. 27, 2018

(65) Prior Publication Data
US 2020/0053461 A1 Feb. 13, 2020

(30) Foreign Application Priority Data
Mar. 24, 2017 (JP) ............................ JP2017-060025

(51) Int. Cl.
*H04S 3/00* (2006.01)
*H04S 7/00* (2006.01)
(Continued)

(52) U.S. Cl.
CPC .............. *H04R 3/12* (2013.01); *G10L 19/008* (2013.01); *H04S 3/008* (2013.01); *H04S 7/308* (2013.01);
(Continued)

(58) Field of Classification Search
CPC ......... H04R 3/12; G10L 19/008; H04S 3/008; H04S 2400/11; H04S 3/002; H04S 7/308
(Continued)

(56) References Cited

U.S. PATENT DOCUMENTS

2012/0328109 A1* 12/2012 Harma .................... H04S 3/002 381/17
2015/0334502 A1 11/2015 Watanabe et al.
(Continued)

FOREIGN PATENT DOCUMENTS

JP H11-113098 A 4/1999
JP 2013-055439 A 3/2013
(Continued)

OTHER PUBLICATIONS

Ville Pulkki, "Virtual Sound Source Positioning Using Vector Base Amplitude Panning", J. Audio. Eng., vol. 45, No. 6, Jun. 1997.
(Continued)

*Primary Examiner* — Paul Kim
*Assistant Examiner* — Ubachukwu A Odunukwe
(74) *Attorney, Agent, or Firm* — ScienBiziP, P.C.

(57) ABSTRACT

An audio signal processing system according to an aspect of the present invention includes an audio signal processing unit configured to select one rendering scheme among a plurality of rendering schemes, based on track information for indicating a reproduction position of an audio signal, and render the audio signal by using the one rendering scheme selected.

12 Claims, 10 Drawing Sheets

(51) Int. Cl.
*H04R 3/12* (2006.01)
*G10L 19/008* (2013.01)

(52) U.S. Cl.
CPC ....... *H04S 2400/11* (2013.01); *H04S 2420/01* (2013.01)

(58) Field of Classification Search
USPC ........................................................... 381/17
See application file for complete search history.

(56) References Cited

U.S. PATENT DOCUMENTS

| | | | | |
|---|---|---|---|---|
| 2016/0073215 | A1* | 3/2016 | De Bruijn | H04S 7/308 381/17 |
| 2016/0269845 | A1 | 9/2016 | Chon et al. | |
| 2017/0249950 | A1* | 8/2017 | Hoerich | H03G 9/005 |
| 2018/0160250 | A1 | 6/2018 | Yamamoto et al. | |
| 2020/0145777 | A1 | 5/2020 | Yamamoto et al. | |

FOREIGN PATENT DOCUMENTS

| | | | |
|---|---|---|---|
| JP | 2014-142475 | A | 8/2014 |
| JP | 2016-525813 | A | 8/2016 |
| JP | 2016-537864 | A | 12/2016 |
| WO | 2016/208406 | A1 | 12/2016 |

OTHER PUBLICATIONS

Duane H. Cooper and Jerald L. Bauck, “Prospects for Transaural Recording”, J. Audio Eng. Soc., vol. 37, No. 1/2, Jan./Feb. 1989.
A. J. Berkhout, D. de Vries, and P. Vogel, “Acoustic control by wave field synthesis”, J. Acoust. Soc. Am. vol. 93(5), US, Acoustical Society of America, May 1993, pp. 2764-2778.

* cited by examiner

201

| | | |
|---|---|---|
| TRACK ID | 1 | |
| TRACK TYPE | OBJECT-BASED | |
| SOUND-EMITTING OBJECT POSITION INFORMATION | 0:00:00-0:01:10 | (1, 0°, 0°) |
| | 0:00:00-0:01:10 | (20, 90°, 0°) |
| | 0:01:10-0:03:46 | (5, 95°, 20°) |
| | ... | ... |
| TRACK ID | 2 | |
| TRACK TYPE | CHANNEL-BASED | |
| SOUND-EMITTING OBJECT POSITION INFORMATION | 0:00:00-1:01:24 | (1, -30°, 0°) |
| ... | ... | |

FIG.4

401

| | | | |
|---|---|---|---|
| TRACK ID | 1 | | |
| TRACK TYPE | OBJECT-BASED | | |
| SOUND-EMITTING OBJECT POSITION INFORMATION | 0:00:00-0:01:10 | (1, 0°, 0°) | 5 |
| | 0:00:00-0:01:10 | (20, 90°, 0°) | 10 |
| | 0:01:10-0:03:46 | (5, 95°, 20°) | 4 |
| | ... | ... | |
| TRACK ID | 2 | | |
| TRACK TYPE | CHANNEL-BASED | | |
| SOUND-EMITTING OBJECT POSITION INFORMATION | 0:00:00-1:01:24 | (1, -30°, 0°) | 10 |
| ... | ... | | |

AUDIO SIGNAL PROCESSING DEVICE AND AUDIO SIGNAL PROCESSING SYSTEM

TECHNICAL FIELD

The present invention relates to an audio signal processing device and an audio signal processing system.

BACKGROUND ART

Currently, users can easily obtain content including multi-channel audio (surround audio) through broadcast waves, disk media such as a Digital Versatile Disc (DVD) and Blu-ray (trade name) Disc (BD), the Internet, and the like. In movie theaters and the like, a large number of stereophonic audio systems using the object-based audio represented by Dolby Atmos are deployed, and in Japan, the 22.2ch audio is adopted as the next generation broadcasting standard, which expands opportunities for a user to experience multi-channel content. Various multi-channeling techniques have been studied for conventional stereo type audio signals, and a technique for multi-channeling based on correlations between channels of stereo signals is disclosed in PTL 1.

A system for reproducing the multi-channel audio is also becoming common as a system that allows audio to be easily enjoyed at home in addition to a facility where large acoustic equipment is deployed such as the movie theaters or holes described above. Specifically, a user (listener) may build an environment within the home for listening to the multi-channel audio such as 5.1ch and 7.1ch by arranging a plurality of speakers, based on the arrangement standard recommended by the International Telecommunication Union (ITU). Furthermore, a technique for reproducing sound localization of the multi-channel using a small number of speakers has also been studied (NPL 1).

CITATION LIST

Patent Literature

PTL 1: JP 2013-055439 A (published on Mar. 21, 2013)
PTL 2: JP 11-113098 A (published on Apr. 23, 1999)

Non Patent Literature

NPL 1: Virtual Sound Source Positioning Using Vector Base Amplitude Panning, VILLE PULKKI, J. Audio. Eng., Vol. 45, No. 6, 1997 June NPL 2: Prospects for Transaural Recording, DUANE H. COOPER AND JERALD L. BAUCK, J. Audio. Eng., Vol. 3, 1989

NPL 3: A. J. Berkhout, D. de Vries, and P. Vogel, "Acoustic control by wave field synthesis", J. Acoust. Soc. Am. Volume 93(5), US, Acoustical Society of America, May 1993, pp. 2764-2778

SUMMARY OF INVENTION

Technical Problem

As described above, an audio reproduction system for reproducing 5.1ch audio may give a sense of lateralization of front, rear, left and right sound images or a sense of being surrounded by sound by arranging speakers, based on the ITU-recommended arrangement standard. However, there is a need to arrange speakers to surround the user's surroundings. The degree of freedom of arrangement positions is not very high. For these reasons, it may be difficult to introduce the above audio reproduction system depending on a shape of a room used for listening or an arrangement of furniture. For example, in a case that there is large furniture, a wall, or the like at the recommended speaker arrangement position for the 5.1ch reproduction, the user may have to arrange the speaker out of the recommended arrangement. As a result, it is not possible to enjoy an intended sound effect.

Various methods of reproducing the multi-channel audio with fewer speakers have been studied, and in a transaural reproduction scheme described in NPL 2 and PTL 2, a minimum of two speakers can be used to reproduce a sound image of all orientations. This scheme has an advantage that, for example, the audio of the all orientations can be reproduced using only a stereo speaker arranged in front of the user. However, this scheme is a technique that assumes in principle a particular listening location (listening location) where acoustic effects are to be obtained. As such, it may occur that in a case that a sound receiving person (listener) deviates from the assumed listening location, the sound image is located at an unexpected position or a localization cannot be sensed in the first place. It is also difficult for a plurality of people to enjoy effects at a sound receiving point.

A method of downmixing multi-channel audio into fewer channels is, for example, downmixing to stereo (2ch). As the method, rendering based on Vector Base Amplitude Panning (VBAP) described in NPL 1 can reduce the number of speakers to be arranged and relatively increase a degree of freedom of arrangement. As for the sound image located between the arranged speakers, both the sense of localization and a quality of the sound are good. However, a sound image not located between these speakers cannot be located in an intended place.

Thus, an aspect of the present invention has an object to provide an audio signal processing device capable of presenting audio rendered in a preferable rendering scheme to a user in a listening situation, and an audio signal processing system provided with the audio signal processing device.

Solution to Problem

In order to solve the above problem, an audio signal processing device according to an aspect of the present invention is an audio signal processing device for receiving an input of at least one audio track and performing a rendering process of calculating output signals to be output to a plurality of audio output devices, the audio signal processing device including: a processor configured to select one rendering scheme among a plurality of rendering schemes for audio signals of each of the at least one audio track or split tracks of each of the at least one audio track, and perform rendering process on the audio signals, wherein the processor selects the one rendering scheme, based on at least one of the audio signals, sound image locations assigned to the audio signals, or accompanying information accompanying the audio signals.

In order to solve the above problem, an audio signal processing system according to an aspect of the present invention includes the audio signal processing device described above and a plurality of audio output devices described above.

Advantageous Effects of Invention

According to an aspect of the present invention, it is possible to present audio rendered in a preferable rendering scheme to a user in a listening situation.

BRIEF DESCRIPTION OF DRAWINGS

FIG. 4 is a diagram illustrating another example of the track information used for the audio signal processing system according to Embodiment 1 of the present invention.

DESCRIPTION OF EMBODIMENTS

Embodiment 1

Hereinafter, an embodiment of the present invention will be described with reference to FIG. 1 to FIG. 8.

Figures 1, 2:
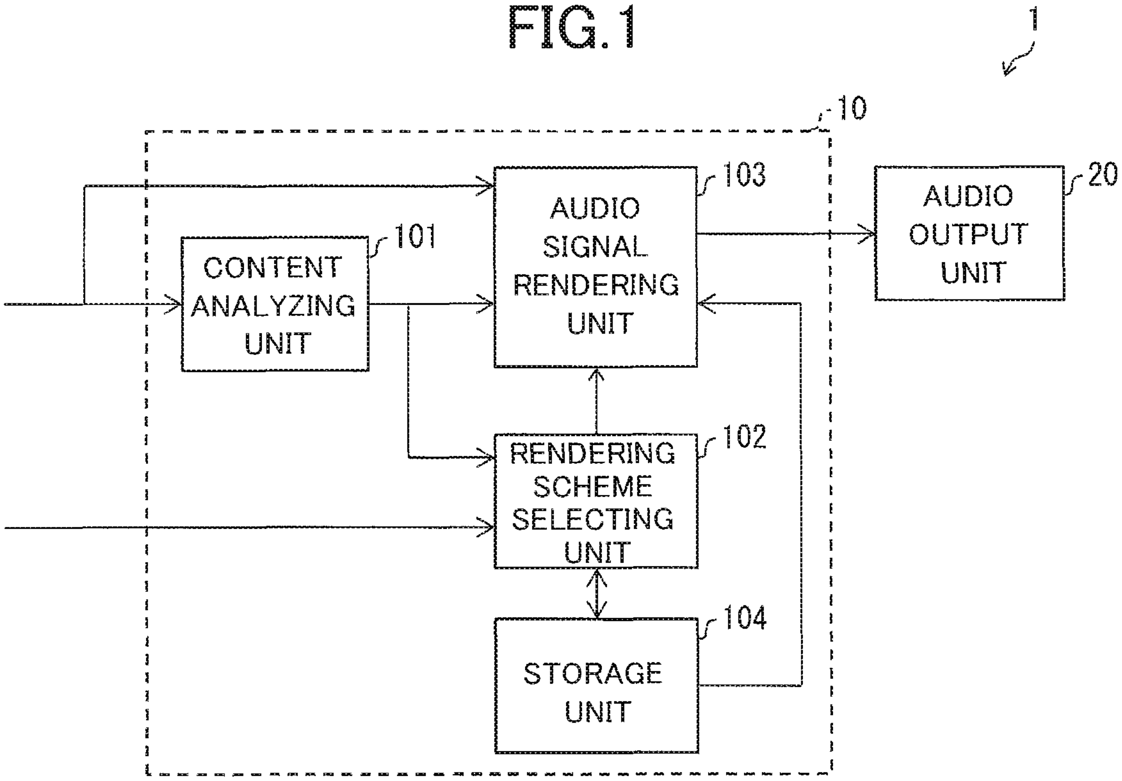
FIG. 1 is a block diagram illustrating a configuration of a main portion of an audio signal processing system according to Embodiment 1 of the present invention.
FIG. 2 is a diagram illustrating an example of track information used for the audio signal processing system according to Embodiment 1 of the present invention.

FIG. 1 is a block diagram illustrating a main configuration of an audio signal processing system 1 according to Embodiment 1. The audio signal processing system 1 according to Embodiment 1 includes an audio signal processing unit 10 (audio signal processing device) and an audio output unit(s) 20 (a plurality of audio output devices).

Audio Signal Processing unit 10

The audio signal processing unit 10 is an audio signal processing device performing rendering process for calculating output signals to be output to each of a plurality of audio output units 20, based on audio signals of one or more audio tracks and a sound image location assigned to the audio signal. Specifically, the audio signal processing unit 10 is an audio signal processing device rendering the audio signals of one or more audio tracks by using different two kinds of rendering scheme. The audio signals after the rendering process are output from the audio signal processing unit 10 to the audio output unit 20.

The audio signal processing unit 10 includes a rendering scheme selecting unit 102 (processor) selecting one rendering scheme from among a plurality of rendering schemes, based on at least one of the above audio signal, the sound image location assigned to the above audio signal, and accompanying information associated with the above audio signal, and an audio signal rendering unit 103 (processor) rendering the audio signal using the one rendering scheme.

The audio signal processing unit 10 includes a content analyzing unit 101 (processor) as illustrated in FIG. 1. The content analyzing unit 101 identifies sound-emitting object position information as described later. The identified sound-emitting object position information is used as information for the rendering scheme selecting unit 102 to select one rendering scheme described above.

The audio signal processing unit 10 includes a storage unit 104 as illustrated in FIG. 1. The storage unit 104 stores therein various parameters required for the rendering scheme selecting unit 102 and the audio signal rendering unit 103, or various generated parameters.

Hereinafter, a configuration of each component will be described.

Content Analyzing Unit 101

The content analyzing unit 101 analyzes an audio track included in video content or audio content recorded on a disk media such as a DVD and BD, a Hard Disc Drive (HDD), or the like, and any accompanying metadata (information) associated with the audio track, and determines the sound-emitting object position information. The sound-emitting object position information is transferred from the content analyzing unit 101 to the rendering scheme selecting unit 102 and the audio signal rendering unit 103.

In Embodiment 1, the audio content received by the content analyzing unit 101 is audio content including two or more audio tracks. This audio track may be a “channel-based” audio track adopted in stereo (2ch), 5.1ch and the like. Alternatively, this audio track may be an “object-based” audio track with an individual sound-emitting object unit being one track and given accompanying information (metadata) describing a positional or volume change in the sound-emitting object.

A concept of the “object-based” audio track will be described. In the object-based audio track, each of the individual sound-emitting object units is recorded in each of the tracks, that is, recorded without being mixed, and these sound-emitting objects are adequately rendered on a player (reproduction equipment) side. Although there is a difference in each standard or format, each of these sound-emitting objects is generally linked to the metadata such as when, where, and what degree of sound volume to emit sound, and the player renders the individual sound-emitting objects, based on this metadata.

On the other hand, a “channel-based” audio track is one that has been adopted in the conventional surround or the like (for example, 5.1ch surround), and is a track in which the individual sound-emitting objects in a state of being mixed in advance are recoded assuming that each sound-emitting object is sounded from a predefined reproduction position (location of the speaker).

Note that the audio track included in one content may include only any one of two audio tracks described above, or two audio tracks in a mixed state.

Sound-Emitting Object Position Information

The sound-emitting object position information is described with reference to FIG. 2.

FIG. 2 conceptually illustrates a configuration of a track information 201 including the sound-emitting object position information that is obtained by being analyzed by the content analyzing unit 101.

The content analyzing unit 101 analyzes all of the audio tracks included in the content and reconfigures the audio tracks as the track information 201 illustrated in FIG. 2.

The track information 201 records an ID of each audio track and a type of the audio track.

Further, in a case that the audio track is an object-based track, the track information 201 is accompanied by one or more pieces of sound-emitting object position information as metadata. The sound-emitting object position information includes a pair of a reproduction time and a sound image location (reproduction position) at the reproduction time.

On the other hand, in a case that the audio track is a channel-based track, a pair of a reproduction time and a sound image location (reproduction position) at the reproduction time are recorded similarly, but the reproduction time in the case of the channel-based track is from a start to an end of the content, and the sound image location at the reproduction time is based on a reproduction position that is predefined in the channel base.

Figure 3:
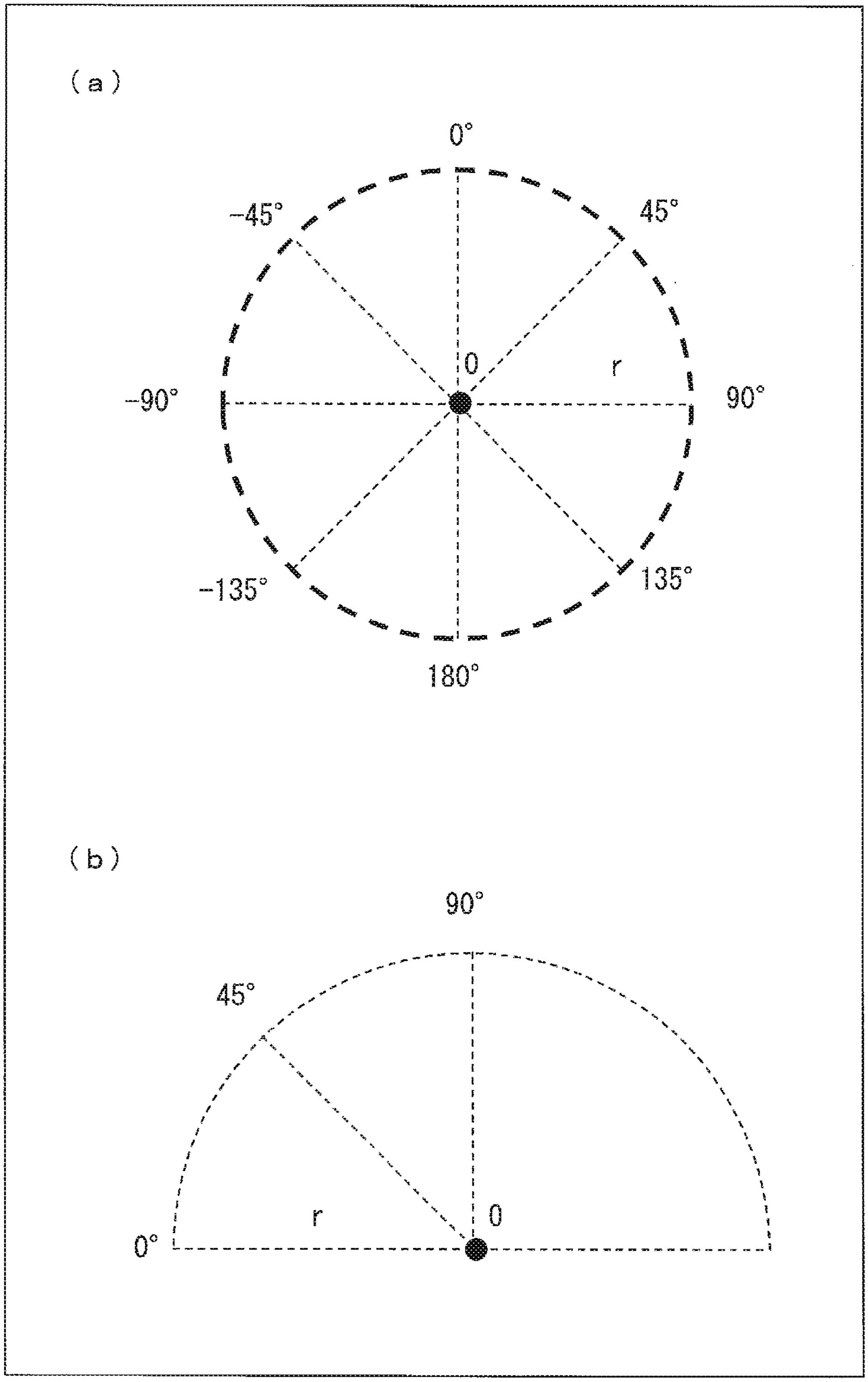
FIG. 3 is a diagram illustrating a coordinate system used for describing the present invention.

Here, the sound image location (reproduction position) recorded as part of the sound-emitting object position information is represented by the coordinate system illustrated in FIG. 3. The coordinate system used here has, as illustrated in a top view of FIG. 3(*a*), an origin O as the center, a moving radius r as a distance from the origin O, a front of the origin O at 0° and a right position and a left position at −90° and 90°, respectively, in which an azimuthal angle is represented as θ, and has, as illustrated in a side view of FIG. 3(*b*), a front of the origin O at 0° and a direct above of the origin O at 90°, in which an elevation angle is represented as φ, and a sound image location and positions of speakers are represented as (r, θ, φ). In the following description, unless otherwise specifically described, the coordinate system of FIG. 3 is used for the sound image location and the positions of the speakers.

The track information 201 may be described in a markup language such as Extensible Markup Language (XML).

Note that, in Embodiment 1, among the information that can be analyzed from the audio track or the accompanying metadata, only information that can identify the position information of each of the sound-emitting objects at any time is recorded as the track information. However, it goes without saying that the track information may include other information. For example, as illustrated in FIG. 4, as in track information 401, reproduction sound volume information at each time for each track may be recorded, for example, at 11 stages of 0 to 10.

Rendering Scheme Selecting Unit 102

The rendering scheme selecting unit 102 determines which of the plurality of rendering schemes is used for rendering each audio track, based on the sound-emitting object position information obtained in the content analyzing unit 101. Then, the information indicating the determined result is output to the audio signal rendering unit 103.

Here, in Embodiment 1, for the purpose of easier understanding of the description, the audio signal rendering unit 103 simultaneously drives two types of rendering schemes (rendering algorithms), a rendering scheme A and a rendering scheme B.

Figure 5:
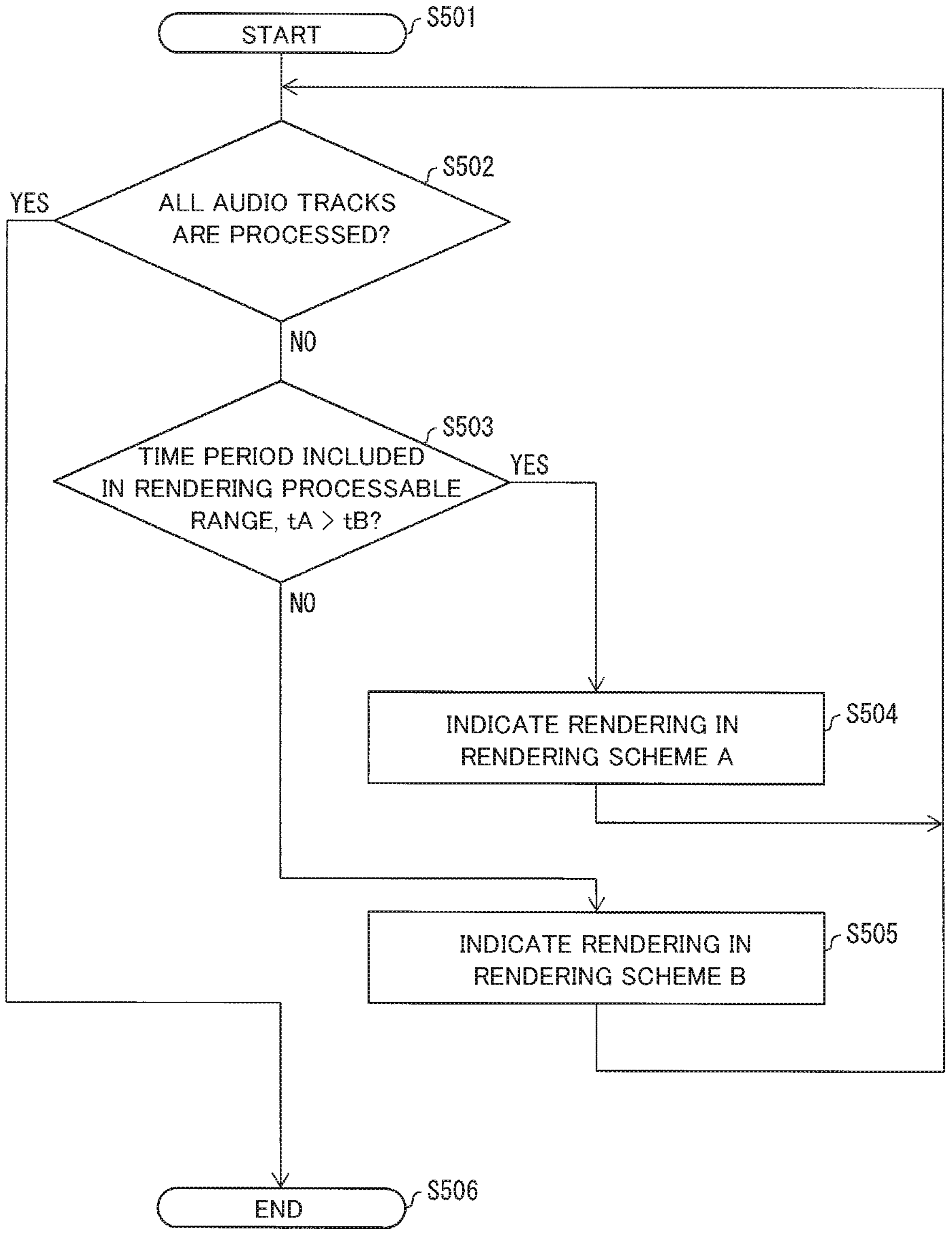
FIG. 5 is a diagram illustrating a processing flow of a rendering scheme selecting unit according to Embodiment 1 of the present invention.

Hereinafter, an operation of the rendering scheme selecting unit 102 will be described with reference to FIG. 5. FIG. 5 is a flowchart illustrating the operation of the rendering scheme selecting unit 102.

In response to reception of the track information 201 (FIG. 2) from the content analyzing unit 101, the rendering scheme selecting unit 102 starts a rendering scheme selection process (step S501).

Then, the rendering scheme selecting unit 102 checks whether the rendering scheme selection process has been performed for all audio tracks (step S502). In a case that the rendering scheme selection process from step S503 is completed for all audio tracks (YES in step S502), the rendering scheme selecting unit 102 ends the rendering scheme selection process (step S506). On the other hand, in a case that there is an audio track not processed in the rendering scheme selection process (NO in step S502), the process of the rendering scheme selecting unit 102 proceeds to step S503.

In step S503, the rendering scheme selecting unit 102 checks all of the sound image locations (reproduction positions) in a period from a reproduction start (track start) of a certain audio track to a reproduction end (track end) from the track information 201, and selects a rendering scheme, based on a distribution of the sound image locations assigned to the audio signals of the certain audio track in that time period. More specifically, in step S503, the rendering scheme selecting unit 102 checks all of the sound image locations (reproduction positions) in a period from the reproduction start to the reproduction end of a certain audio track from the track information 201, and determines a time period to during which the sound image locations are included within a rendering processable range in the rendering scheme A and a time period tB during which the sound image locations are included within a rendering processable range in the rendering scheme B.

Figure 6:
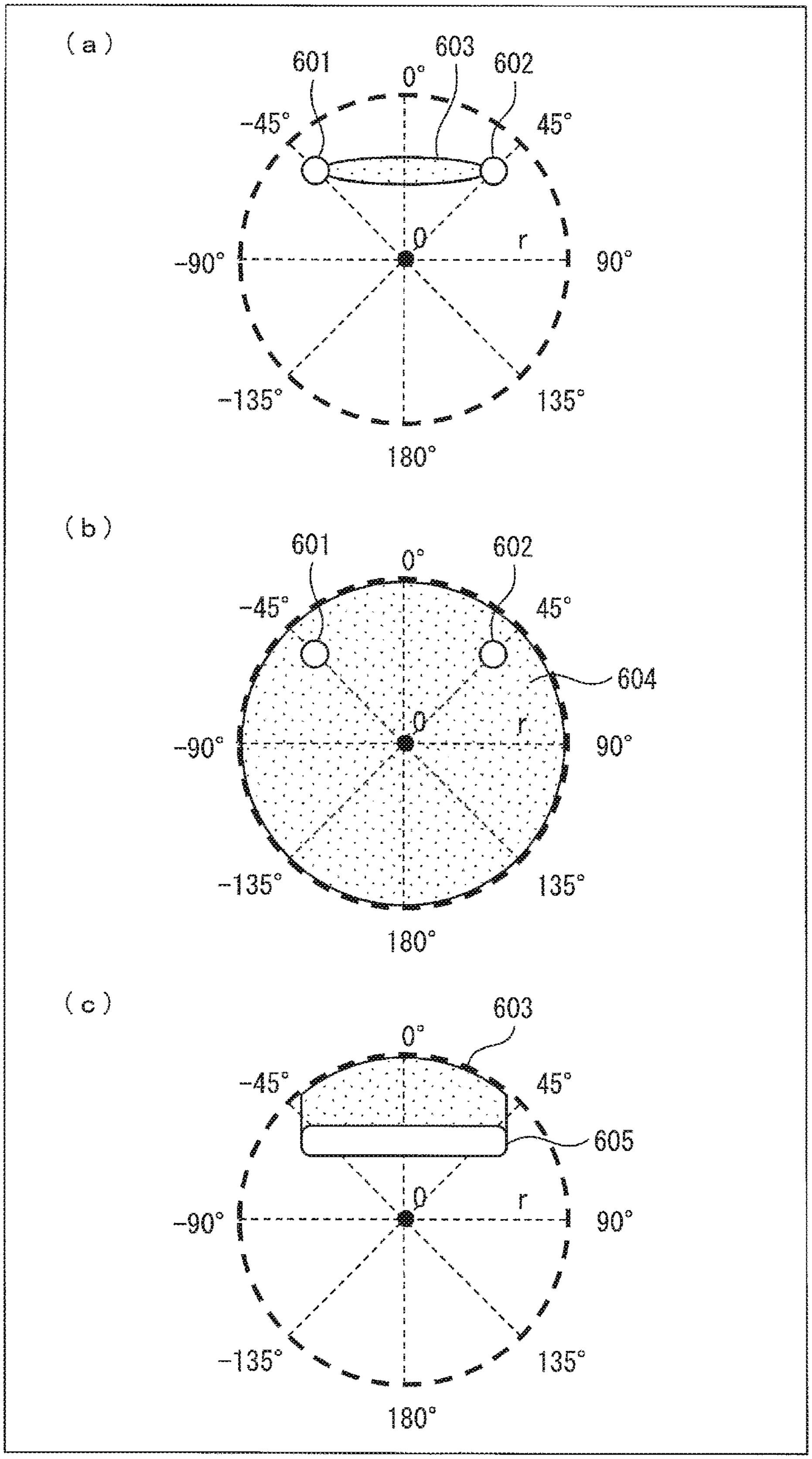
FIG. 6 is a schematic diagram of a listening effective range for each rendering scheme.

Here, the rendering processable range is indicative of a range within which a sound image can be arranged in a particular rendering scheme. For example, FIG. 6 schematically illustrates a range within which a sound image can be arranged in each of the rendering schemes. As illustrated in FIG. 6(*a*), in a situation that speakers 601 and 602 are arranged at −45° and 45°, respectively, and in a case of rendering using the speakers in a sound pressure panning scheme, a processable range is a region 603 between the speakers 601 and 602. As illustrated in FIG. 6(*b*), in a case of rendering using the same speakers 601 and 602 in a transaural scheme, a rendering processable range can be basically defined as a region 604 that is an entire periphery of the user. As illustrated in FIG. 6(*c*), in a case of reproduction in a Wave Field Synthesis (WFS) scheme as disclosed in NPL 3 using an array speaker 605 in which a plurality of speaker units are arranged in a straight line at a constant interval, a processable range can be defined as a region 603 behind the speaker array. However, in Embodiment 1, the description is given with the processable range being a finite range within a concentric circle of a radius r centered on the origin O.

These rendering processable ranges are recorded in advance in the storage unit 104, and are read as appropriate.

In step S503, furthermore, the rendering scheme selecting unit 102 compares tA with tB. Then, in a case that tA is greater than tB, that is, the time period included within the rendering processable range in the rendering scheme A is longer (YES in step S503), the process of the rendering scheme selecting unit 102 proceeds to step S504. In step S504, the rendering scheme selecting unit 102 selects the rendering scheme A as one rendering scheme used in rendering the audio signals of the certain audio track, and outputs a signal indicating that rendering is to be performed using the rendering scheme A to the audio signal rendering unit 103.

On the other hand, in a case that tB is equal to or greater than tA, that is, the time period included within the rendering processable range in the rendering scheme B is equal to or greater than that in the rendering scheme A (NO in step S503), the process of the rendering scheme selecting unit 102 proceeds to step S505. In step S505, the rendering scheme selecting unit 102 selects the rendering scheme B as one rendering scheme used in rendering the audio signals of the certain audio track, and outputs a signal indicating that rendering is to be performed using the rendering scheme B to the audio signal rendering unit 103.

As described above, in Embodiment 1, the entire audio track is fixed to the rendering scheme in either the rendering scheme A or the rendering scheme B. Fixing the rendering scheme in one audio track to one scheme in this way may allow the user (listener) to listen with no uncomfortable feeling and may enhance the sense of immersion. That is, in a case that the rendering scheme switches during a period from the reproduction start to the reproduction end of a certain audio track, the user may feel uncomfortable and may possibly lose the sense of immersion into the video content or the audio content. However, fixing the rendering scheme in one audio track to one scheme as in Embodiment 1 can circumvent such a risk.

However, the present invention is not limited to an aspect in which the rendering scheme is fixed in one audio track. For example, one audio track may be divided into split tracks in arbitrary time units, and the rendering scheme selection process in the operation flow in FIG. 5 may be applied to each of the split tracks. The arbitrary time unit may be, for example, chapter information assigned to the content, and the like, or the switching of the scene within the chapter may be analyzed and divided into scene units, to which the process is applied. The scene switching can be detected by analyzing the video, but can also be detected by analyzing the metadata describe above.

Figure 7:
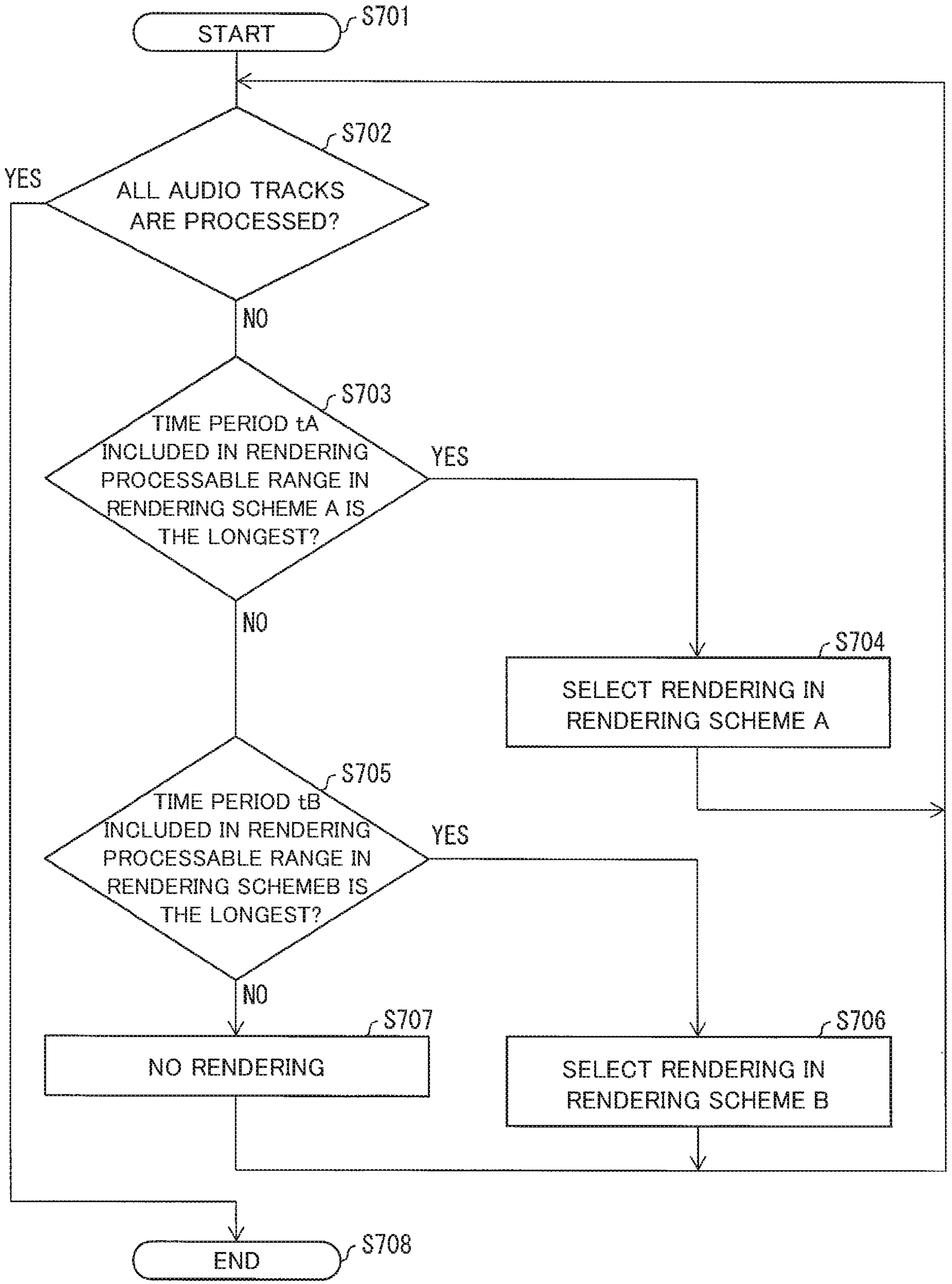
FIG. 7 is a diagram illustrating a processing flow of another form of the rendering scheme selecting unit according to Embodiment 1 of the present invention.

In the foregoing description, all the sound image locations in the audio track have been described as falling within the rendering processable range in either rendering scheme A or the rendering scheme B, but in another case, that is, in a case that the sound image locations are not included within the rendering processable range in the rendering scheme A or the rendering processable range in the rendering scheme B, the rendering scheme selecting unit 102 may process that case in a flow as illustrated in FIG. 7.

FIG. 7 is a diagram illustrating an operation flow of another aspect of the operation flow illustrated in FIG. 5. The flow of another aspect is described using FIG. 7.

In the operation flow in FIG. 7, as with the operation flow illustrated in FIG. 5, the rendering scheme selecting unit 102 starts a rendering scheme selection process in response to reception of the track information 201 (step S701).

Then, the rendering scheme selecting unit 102 checks whether the rendering scheme selection process has been performed for all audio tracks (step S702). In a case that the rendering scheme selection process from step S703 is completed for all audio tracks (YES in step S702), the rendering scheme selecting unit 102 ends the rendering scheme selection process (step S708). On the other hand, in a case that there is a track not processed in the rendering scheme selection process (NO in step S702), the process of the rendering scheme selecting unit 102 proceeds to step S703.

In step S703, the rendering scheme selecting unit 102 checks all of the sound image locations (reproduction positions) in a period from the reproduction start to the reproduction end of a certain audio track from the track information 201, and determines a time period tA during which the sound image location are included within a rendering processable range in the rendering scheme A, a time period tB during which the sound image locations are included within a rendering processable range in the rendering scheme B, and a time period tNowhere which is out of any rendering scheme.

In this case, in a case that the time period tA during which the sound image locations are included within the rendering processable range in the rendering scheme A is the longest, that is, tA>tB, and tA>tNowhere (YES in step S703), the process of the rendering scheme selecting unit 102 proceeds to step S704. In step S704, the rendering scheme selecting unit 102 selects the rendering scheme A as one rendering scheme used in rendering the audio signals of the certain audio track, and outputs a signal indicating that rendering is to be performed using the rendering scheme A to the audio signal rendering unit 103.

In step S703, in a case that tA is not the longest (NO in step S703), and that the time period tB during which the sound image locations are included within the rendering processable range in the rendering scheme B is the longest, that is, tB>tA, and tB>tNowhere (YES in step S705), the process of the rendering scheme selecting unit 102 proceeds to step S706. In step S706, the rendering scheme selecting unit 102 selects the rendering scheme B as one rendering scheme used in rendering the audio signals of the certain audio track, and outputs a signal indicating that rendering is to be performed using the rendering scheme B to the audio signal rendering unit 103.

In step S705, in a case that the time tNowhere during which the sound image locations are included within neither the rendering processable range in the rendering scheme A nor the rendering processable range in the rendering scheme B is the longest, that is, tNowhere>tA and tNowhere>tB (NO in step S705), the process of the rendering scheme selecting unit 102 proceeds to step S707. In step S707, the rendering scheme selecting unit 102 indicates the audio signal rendering unit 103 not to render the audio signals of the certain audio track.

Note that in this flow of another aspect, if tA=tB>tNowhere, the rendering scheme selecting unit 102 may be configured in advance to prioritize either of tA and tB. The rendering scheme selecting unit 102 may be configured in advance to prioritize tA in a case of tA=tNowhere>tB, and prioritize tB in a case of tB=tNowhere>tA.

The selectable rendering scheme is described as two types in Embodiment 1, but it goes without saying that the rendering scheme can be selected from three or more types in a system.

Audio Signal Rendering Unit 103

The audio signal rendering unit 103 configures an audio signal to be output from the audio output unit 20, based on an input audio signal and an indication signal output from the rendering scheme selecting unit 102.

Specifically, the audio signal rendering unit 103 receives the audio signals included in the content, renders the audio signals according to the rendering scheme based on the indication signal from the rendering scheme selecting unit 102 and mix the resulting audio signals, and then, outputs the rendered and mixed audio signals to the audio output unit 20.

In other words, the audio signal rendering unit 103 simultaneously drives two types of rendering algorithms, and switches the rendering algorithms to be used, based on the indication signal output from the rendering scheme selecting unit 102 to render the audio signals.

Here, the rendering refers to performing processing for converting the audio signals included in the content (input audio signals) into signals to be output from the audio output unit 20.

Hereinafter, an operation of the audio signal rendering unit 103 will be described using a flow illustrated in FIG. 8.

Figure 8:
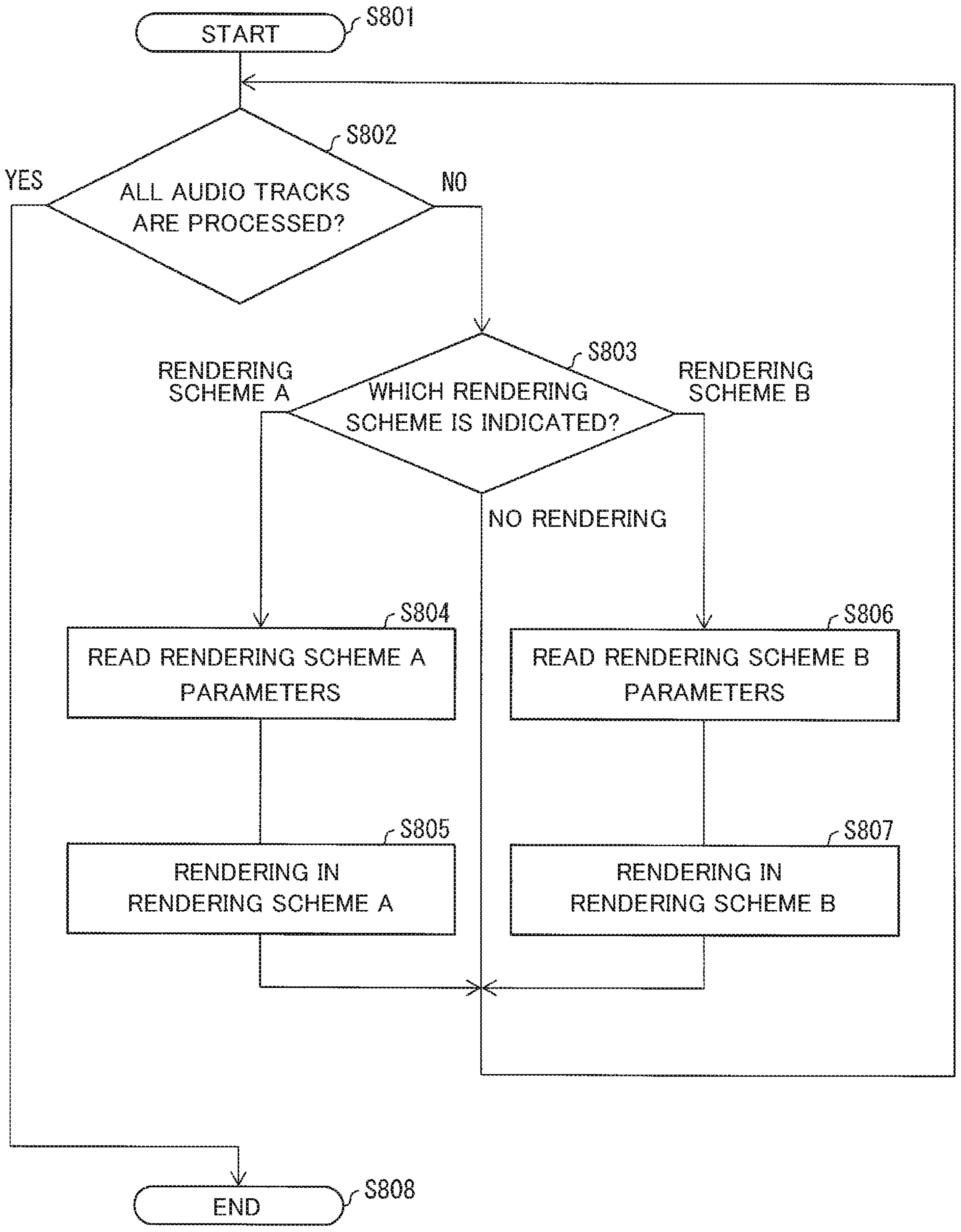
FIG. 8 is a diagram illustrating a processing flow of an audio signal rendering unit according to Embodiment 1 of the present invention.

FIG. 8 is flowchart illustrating an operation of the audio signal rendering unit 103.

In response to reception of the input audio signals and the indication signal from the rendering scheme selecting unit 102, the audio signal rendering unit 103 starts the rendering process (step S801).

First, the audio signal rendering unit 103 checks whether the rendering process has been performed for all audio tracks (step S802). In step S802, in a case that the rendering process from step S803 is completed for all audio tracks (YES in step S802), the audio signal rendering unit 103 ends the rendering process (step S808). On the other hand, in a case that there is an audio track not processed (NO in step S802), the audio signal rendering unit 103 performs rendering using the rendering scheme based on the indication signal from the rendering scheme selecting unit 102. Here, in a case that the indication signal indicates the rendering scheme A (rendering scheme A in step S803), the audio signal rendering unit 103 reads the parameters necessary to render the audio signals by using the rendering scheme A from the storage unit 104 (step S804), and performs rendering based on the read parameters on the audio signals of the certain audio track (step S805). Similarly, in a case that the indication signal indicates the rendering scheme B (rendering scheme B in step S803), the audio signal rendering unit 103 reads the parameters necessary to render the audio signals by using the rendering scheme B from the storage unit 104 (step S806), and performs rendering based on the read parameters on the audio signals for the certain audio track (step S807). In a case that the indication signal indicates no rendering (no rendering in step S803), the audio signal rendering unit 103 does not render audio signals of the certain audio track and includes no audio signal in the output audio.

Note that in a case that the sound image location of the audio track exceeds the rendering processable range in the rendering scheme indicated by the rendering scheme selecting unit 102, the sound image location is changed to a sound image location included in the processable range, and the audio signals of the audio track are rendered using the rendering scheme.

Storage Unit 104

The storage unit 104 includes a secondary storage unit device for recording various pieces of data used by the rendering scheme selecting unit 102 and audio signal rendering unit 103. The storage unit 104 is constituted by, for example, a magnetic disk, an optical disk, a flash memory, or the like, and more specific examples include an HDD, a Solid State Drive (SSD), a SD memory card, a BD, and a DVD. The rendering scheme selecting unit 102 and the audio signal rendering unit 103 read data from the storage unit 104 as necessary. Various parameter data including coefficients and the like calculated in the rendering scheme selecting unit 102 may be recorded in the storage unit 104.

Audio Output Unit 20

The audio output unit 20 outputs the audio obtained in the audio signal rendering unit 103. Here, the audio output unit 20 includes one or more speakers, and each speaker includes one or more speaker units and an amplifier (AMP) for driving the speaker units.

For example, in a case that one of the rendering schemes includes a wave field synthesis scheme as described above, at least one of the constituent speakers includes an array speaker in which a plurality of speaker units are arranged in a straight line at a constant interval.

As described above, depending on position information of each audio track obtained from the content and the processable range for each rendering scheme, the rendering scheme is automatically selected, and audio reproduction is performed, while sound quality changes due to changes in audio reproduction schemes in the same audio track can be suppressed by fixing the rendering scheme in the audio track. This allows good audio to be delivered to the user. In specific reproduction units such as each content, each scene, and the like, the sound quality of the same audio track can be prevented from changing unnaturally and the sense of immersion into the content can be enhanced.

Note that in Embodiment 1, the content including a plurality of audio tracks is to be reproduced, but the present invention is not limited thereto, and the content including one audio track may be to be reproduced. In that case, a preferable rendering scheme for the one audio track is selected from a plurality of rendering schemes.

Embodiment 2

Figure 9:
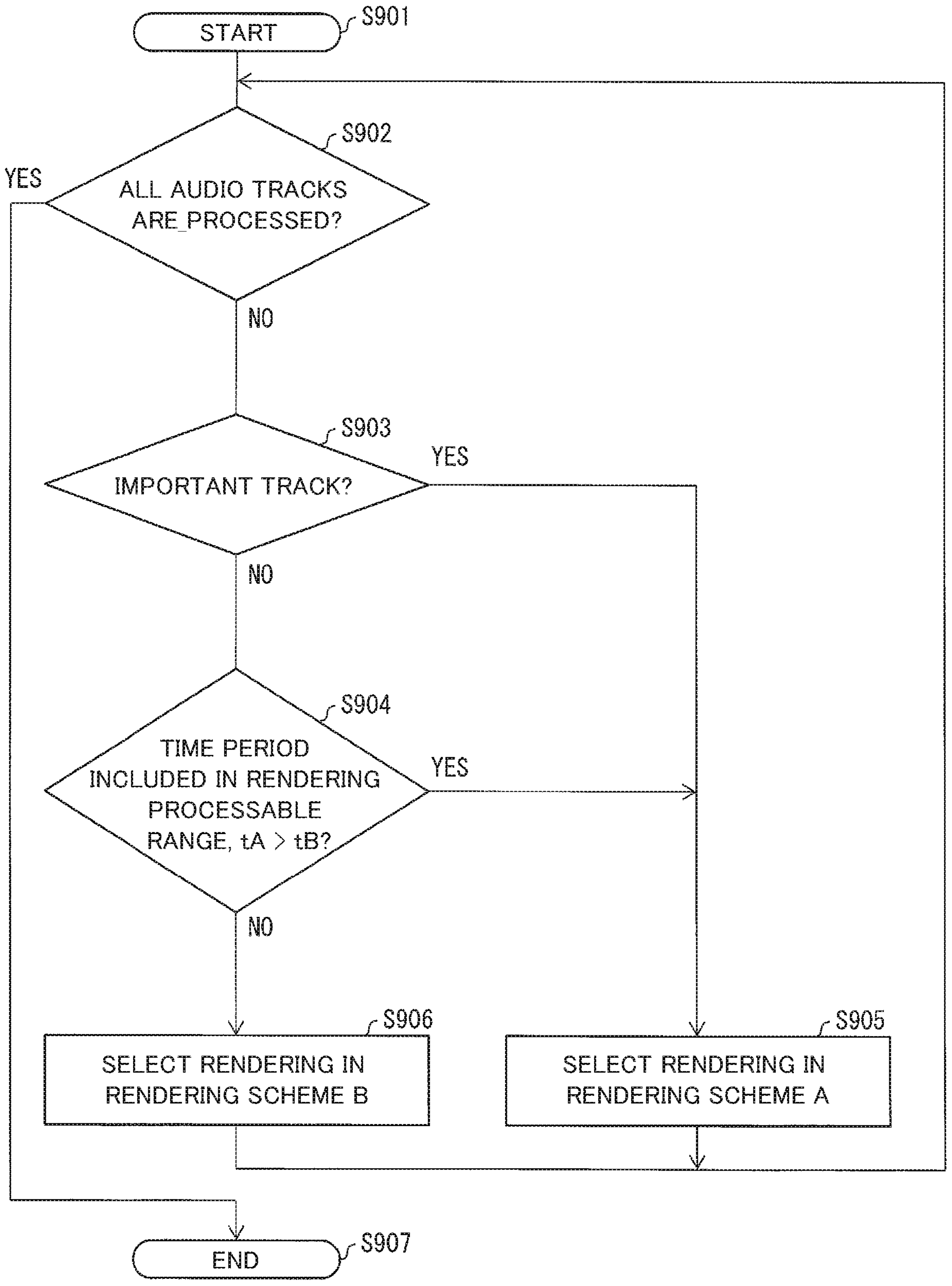
FIG. 9 is a diagram illustrating a processing flow of a rendering scheme selecting unit included in an audio signal processing system according to Embodiment 2 of the present invention.
Figure 10:
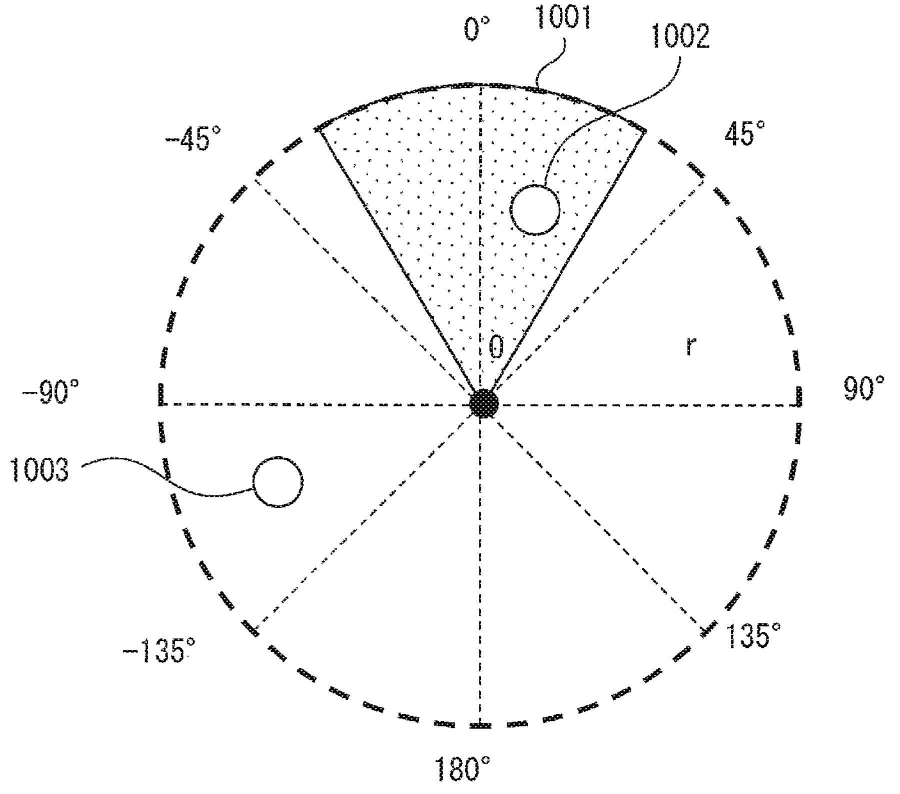
FIG. 10 is a schematic diagram illustrating a sound receiving area in a case of an important audio track.

Embodiment 2 of the present invention will be described below with reference to FIG. 9 and FIG. 10. For the sake of convenience of description, members having the same functions as the members described above in Embodiment 1 are designated by the same reference signs, and descriptions thereof will be omitted.

In Embodiment 1 described above, the aspect example is described in which the content analyzing unit 101 analyzes the audio track included in the content to be reproduced and any accompanying metadata to determine the sound-emitting object position information, based on which one rendering scheme is selected. However, the operations of the content analyzing unit 101 and the rendering scheme selecting unit 102 are not limited thereto.

Specifically, the content analyzing unit 101 determines that a certain audio track is an important track which is to be more clearly presented to the user in a case that narration text information accompanies the metadata accompanying the audio track, and records the information in the track information 201 (FIG. 2). Here, a selection procedure of the rendering scheme for a case in which the rendering scheme A has a S/N ratio lower than the rendering scheme B and is an audio reproduction scheme which can more clearly present the audio to the user, is described using the flow in FIG. 9.

In response to reception of the track information 201 (FIG. 2) from the content analyzing unit 101, the rendering scheme selecting unit 102 starts a rendering scheme selection process (step S901).

Then, the rendering scheme selecting unit 102 checks whether the rendering scheme selection process has been performed for all audio tracks (step S902), and in a case that the rendering scheme selection process from step S903 is completed for all audio tracks (YES in step S902), the rendering scheme selecting unit 102 ends the rendering scheme selection process (step S907). On the other hand, in a case that there is an audio track not processed in the rendering scheme selection (NO in step S902), the process of the rendering scheme selecting unit 102 proceeds to step S903.

In step S903, the rendering scheme selecting unit 102 determines whether a track is an important track from the track information 201 (FIG. 2). In a case that the audio track is an important track (YES in step S903), the process of the rendering scheme selecting unit 102 proceeds to step S905. In step S905, the rendering scheme selecting unit 102 selects the rendering scheme A as one rendering scheme used in rendering the audio signals of the audio track.

On the other hand, in step S903, in a case that the audio track is not an important track (NO in step S903), the process of the rendering scheme selecting unit 102 proceeds to step S904.

In step S904, the rendering scheme selecting unit 102 checks all of the sound image locations (reproduction positions) from the reproduction start to the reproduction end of the audio track from the track information 201 (in FIG. 2), similarly to step S503 in FIG. 5 in Embodiment 1, and determines a time period tA during which the sound image locations are included within a rendering processable range in the rendering scheme A and a time period tB during which the sound image locations are included within a rendering processable range in the rendering scheme B.

In step S904, furthermore, the rendering scheme selecting unit 102 compares tA with tB. Then, in a case that tA is greater than tB, that is, the time period included within the rendering processable range in the rendering scheme A is longer (YES in step S904), the process of the rendering scheme selecting unit 102 proceeds to step S905. In step S905, the rendering scheme selecting unit 102 selects the rendering scheme A as one rendering scheme used in rendering the audio signals of the certain audio track, and outputs a signal indicating that rendering is to be performed using the rendering scheme A to the audio signal rendering unit 103.

On the other hand, in a case that tB is equal to or greater than tA, that is, the time period included within the rendering processable range in the rendering scheme B is equal to or greater than that in the rendering scheme A (NO in step S904), the process of the rendering scheme selecting unit 102 proceeds to step S906. In step S906, the rendering scheme selecting unit 102 selects the rendering scheme B as one rendering scheme used in rendering the audio signals of the certain audio track, and outputs a signal indicating that rendering is to be performed using the rendering scheme B to the audio signal rendering unit 103.

Note that in Embodiment 2, the rendering scheme selecting unit 102 determines an important track depending on a presence or absence of the text information, but may determine whether or not a track is an important track in other ways. For example, in a case that an audio track is a channel-based audio track, it is considered that an audio track of which arrangement position corresponds to the center (C) includes many audio signals that are considered important in the content, such as of dialogues and narrations. Thus, the rendering scheme selecting unit 102 may determine that such track is an important track and other tracks are non-important tracks. In this case, specifically, the aspect may be such that the accompanying information associated with the audio signals includes information indicating a type of the audio included in the audio signal, and the rendering scheme selecting unit 102 selects one rendering scheme, concerning the audio signals of the audio track or the split tracks, based on whether or not the accompanying information associated with the audio signals indicates that the audio signals include dialogues or narrations.

The rendering scheme selecting unit 102 may also determine an important track, concerning the audio signals of the audio track, depending on whether or not the sound image location assigned to any of the audio signals is included in the sound receiving area (listening area) configured in advance. For example, as illustrated in FIG. 10, the rendering scheme selecting unit 102 may determine that an audio track 1002 is an important track and an audio track 1003 is a non-important track, the audio track 1002 being of the audio signals of which sound image locations are within a sound receiving area 1001 having θ of ±30°, that is, an area including the front of the listener, the audio track 1003 being of the audio signals of which sound image locations are not within the sound receiving area.

As described above, by taking into account the position information of each audio track obtained from the content and the rendering processable range specified by each rendering scheme as well as a degree of importance of each audio track, the sound quality changes due to changes in the audio reproduction schemes in the same audio track can be suppressed, and clearer audio can be delivered to the user in the important track.

Embodiment 3

Embodiment 3 of the present invention will be described below with reference to FIG. 11. For the sake of convenience of description, members having the same functions as the members described above in Embodiment 1 are designated by the same reference signs, and descriptions thereof will be omitted.

A difference between Embodiment 1 described above and Embodiment 3 is in the content analyzing unit 101 and the rendering scheme selecting unit 102. The content analyzing unit 101 and the rendering scheme selecting unit 102 in Embodiment 3 will be described below.

The content analyzing unit 101 analyses the audio track and records a maximum reproduction sound pressure in the track information (201 illustrated in FIG. 2, for example).

Hereinafter, a procedure of the rendering scheme selection process of the rendering scheme selecting unit 102 in a case that the maximum sound pressure is SplMax in a certain audio track of the input content is described using an operation flow in FIG. 11. Note that in Embodiment 3, the maximum sound pressures capable of reproduction in the rendering schemes A and B are defined as SplMaxA and SplMaxB, respectively, where SplMaxA>SplMaxB.

In response to reception of the track information in which the maximum reproduction sound pressure is recorded from the content analyzing unit 101, the rendering scheme selecting unit 102 starts the rendering scheme selection process (steps S1101).

Then, the rendering scheme selecting unit 102 checks whether the rendering scheme selection process has been performed for all audio tracks (step S1102). In a case that the rendering scheme selection process from step S1103 is completed for all audio tracks (YES in step S1102), the rendering scheme selecting unit 102 ends the rendering scheme selection process (step S1107). On the other hand, in a case that there is an audio track not processed in the rendering scheme selection process (NO in step S1102), the process of the rendering scheme selecting unit 102 proceeds to step S1103.

In step S1103, the rendering scheme selecting unit 102 compares the maximum reproduction sound pressure SplMax of the audio track to be processed with the maximum sound pressure SplMaxB (threshold) capable of reproduction in the rendering scheme B. Then, in a case that SplMax is greater than SplMaxB, that is, the reproduction sound pressure required for the audio track is incapable of reproduction in the rendering scheme B (YES in step S1103), the rendering scheme selecting unit 102 selects the rendering scheme A as a rendering scheme for that audio track (step S1105). On the other hand, in a case that the reproduction sound pressure of the audio track is capable of reproduction in the rendering scheme B (NO in step S1103), the process of the rendering scheme selecting unit 102 proceeds to step S1104.

In step S1104, the rendering scheme selecting unit 102 checks all of the sound image locations (reproduction positions) from the reproduction start to the reproduction end of the audio track from the track information, similarly to step S503 in FIG. 5 in Embodiment 1, and determines a time period tA during which the sound image locations are included within a rendering processable range in the rendering scheme A and a time period tB during which the sound image locations are included within a rendering processable range in the rendering scheme B.

In step S1104, furthermore, the rendering scheme selecting unit 102 compares tA with tB. Then, in a case that tA is greater than tB, that is, the time period included within the rendering processable range in the rendering scheme A is longer (YES in step S1104), the process of the rendering scheme selecting unit 102 proceeds to step S1105. In step S1105, the rendering scheme selecting unit 102 selects the rendering scheme A as one rendering scheme used in rendering the audio signals of the audio track, and outputs a signal indicating that rendering is to be performed using the rendering scheme A to the audio signal rendering unit 103.

On the other hand, in a case that tB is equal to or greater than tA, that is, the time period included within the rendering processable range in the rendering scheme B is equal to or greater than that in the rendering scheme A (NO in step S1104), the process of the rendering scheme selecting unit 102 proceeds to step S1106. In step S1106, the rendering scheme selecting unit 102 selects the rendering scheme B as one rendering scheme used in rendering the audio signals of the audio track, and outputs a signal indicating that rendering is to be performed using the rendering scheme B to the audio signal rendering unit 103.

Figure 11:
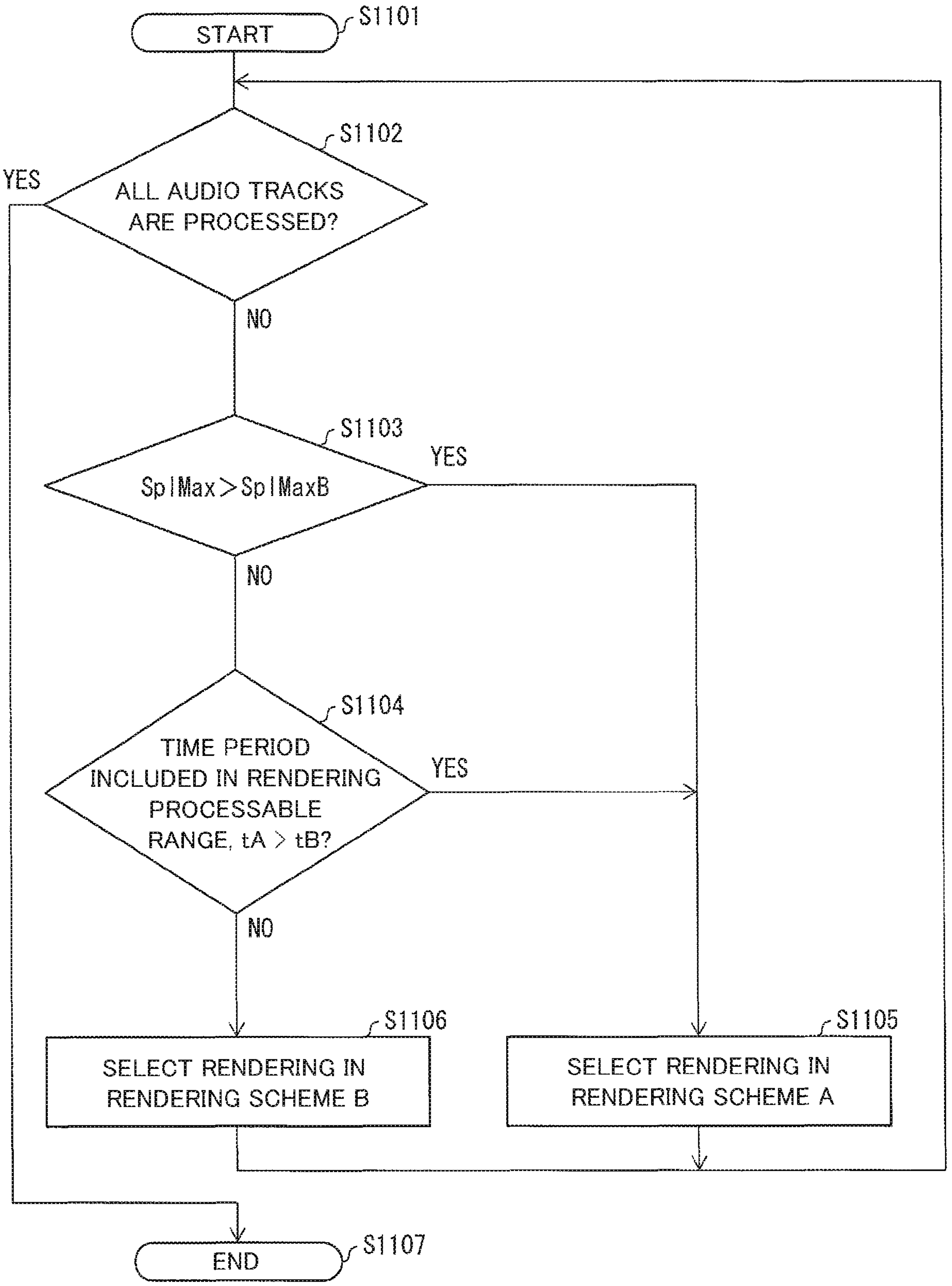
FIG. 11 is a diagram illustrating a processing flow of a rendering scheme selecting unit included in an audio signal processing system according to Embodiment 3 of the present invention.

Note that in the operation flow of FIG. 11, only the maximum reproduction sound pressure obtained by analyzing the content is considered, but the process may also depend on the sound volume on the speaker side. In this case, in step S1103 in FIG. 11, the rendering scheme selecting unit 102 compares SplCurrent obtained from a maximum reproduction sound volume of the track and a current sound volume with SplMaxB.

As described above, depending on the sound image location of each audio track obtained from the content and each rendering processable range in the rendering scheme as well as a degree of importance of each audio track, the rendering scheme is automatically selected, and audio reproduction is performed, while the sound quality changes due to changes in the audio reproduction schemes in the same audio track can be suppressed, and clearer audio with less distortion can be delivered to the user in reproduction in the maximum sound pressure.

Supplement

An audio signal processing device (audio signal processing unit 10) according to Aspect 1 of the present invention is an audio signal processing device (audio signal processing unit 10) for receiving an input of at least one audio track and performing a rendering process of calculating output signals to be output to a plurality of audio output devices (speakers 601, 602, 605), the audio signal processing device including a processor (rendering scheme selecting unit 102 and audio signal rendering unit 103) configured to select one rendering scheme among a plurality of rendering schemes (rendering schemes A and B) for audio signals of each of the at least one audio track or split tracks of each of the at least one audio track, and perform rendering process on the audio signals, wherein the processor (rendering scheme selecting unit 102 and audio signal rendering unit 103) selects the one rendering scheme, based on at least one of the audio signals, sound image locations assigned to the audio signals, or accompanying information accompanying the audio signals.

According to the above configuration, the optimal rendering scheme is selected and audio reproduction is performed, while sound quality changes due to changes in audio reproduction schemes in the same audio track can be suppressed by fixing the rendering scheme in the audio track. This allows good audio to be delivered to the user. This provides the equivalent effect also in a case that an optimal rendering scheme is selected for the audio signals of the split track obtained by dividing one audio track by any time units and the audio signals of the split tracks are rendered to reproduce the audio.

With such a configuration, in specific reproduction units such as of each content, of each scene, and the like, the sound quality of the same audio track or the same scene can be prevented from changing unnaturally and the sense of immersion into the content or the scene can be enhanced.

In the audio signal processing device (audio signal processing unit 10) according to Aspect 2 of the present invention, in Aspect 1 described above, the processor (rendering scheme selecting unit 102) may be configured to select the one rendering scheme, for the audio signals of each of the at least one audio track or each of the split tracks, based on a distribution of the sound image locations assigned to the audio signals in a period from a track start to a track end.

According to the above configuration, for example, concerning the audio signals of the audio track or the split tracks, it is possible to determine one rendering processable range in which the sound image locations from the track start to the track end are included for the longest time period, and perform rendering using the rendering scheme specifying the one rendering processable range. According to this example, the reproduction can be performed at a proper position to be located for a relatively long period in the period from the track start to the track end, and in specific reproduction units such as each content, each scene, and the like, the sound quality of the same audio track or the same scene can be prevented from changing unnaturally and the sense of immersion into the content or the scene can be enhanced.

In the audio signal processing device (audio signal processing unit 10) according to Aspect 3 of the present invention, in Aspect 1 described above, the processor (rendering scheme selecting unit 102) may be configured to select the one rendering scheme, for the audio signals of each of the at least one audio track or each of the split tracks, based on whether or not the sound image locations assigned to the audio signals are included in a sound receiving area 1001 configured in advance.

To be more specific, in the audio signal processing device (audio signal processing unit 10) according to Aspect 4 of the present invention, in Aspect 3 described above, the sound receiving area 1001 may be an area including a front of a listener.

The sound image locations of the audio signals being included in the area including the front of the listener means that the audio signals are audio signals which are desired to be listened to by the listener or are to be listened to by the listener. Therefore, the determination is made based on whether or not the sound image locations of the audio signals are included in the area including the front to the listener, and the audio can be reproduced by the optimal rendering scheme depending on a result of the determination.

In the audio signal processing device (audio signal processing unit 10) according to Aspect 5 of the present invention, in Aspect 1 described above, the accompanying information accompanying the audio signals may include information for indicating a type of an audio included in the audio signals, and the processor (rendering scheme selecting unit 102) may select the one rendering scheme, for the audio signals of each of the at least one audio track or each of the split tracks, based on whether or not the accompanying information accompanying the audio signals indicates that the audio signals include a dialogue or a narration.

In a case that it is indicated that the audio signals of the audio track or the split tracks include dialogues or narrations, the audio signals can be said to be audio signals which are desired to be listened to by the listener or are to be listened to by the listener. Therefore, the audio can be reproduced by the optimal rendering scheme, based on whether or not it is indicated that the audio signals include dialogues or narrations.

In the audio signal processing device (audio signal processing unit 10) according to Aspect 6 of the present invention, in Aspect 1 described above, the accompanying information accompanying the audio signals may include information for indicating a type of an audio included in the audio signals, and the processor (rendering scheme selecting unit 102), for the audio signals of each of the at least one audio track or each of the split tracks, may select a rendering scheme having a lowest S/N ratio among the plurality of rendering schemes as the one rendering scheme in a case that the sound image locations assigned to the audio signals are included in a sound receiving area configured in advance, and that the accompanying information accompanying the audio signals indicates that the audio signals include a dialogue or a narration, and select the one rendering scheme, based on a distribution of the sound image locations assigned to the audio signals in a period from a track start to a track end in other cases.

According to the above configuration, the audio which is to be listened to by the listener can be rendered by the rendering scheme having the lower S/N ratio, concerning the audio signals of the audio track or the split tracks.

On the other hand, in a case of the audio which are not to be listened to by the listener, the one rendering scheme can be selected, concerning the audio signals of the audio track or the split tracks, based on a distribution of the sound image locations assigned to the audio signals in a period from a track start to a track end. For example, it is possible to, concerning the audio signals of the audio track or the split tracks, determine one rendering processable range in which the sound image locations from the track start to the track end are included for the longest time period, and perform rendering using the rendering scheme specifying the one rendering processable range. According to this example, the reproduction can be performed at a proper position to be located for a relatively long period in the period from the track start to the track end, and in particular reproduction units such as of each content, of each scene, and the like, the sound quality of the same audio track or the same scene can be prevented from changing unnaturally and the sense of immersion into the content or the scene can be enhanced.

In the audio signal processing device (audio signal processing unit 10) according to Aspect 7 of the present invention, in Aspect 1 described above, the processor (rendering scheme selecting unit 102) may select the one rendering scheme, for the audio signals of each of the at least one audio track or each of the split tracks, based on a maximum reproduction sound pressure of the audio signals.

A portion of the input audio signals indicating the maximum reproduction sound pressure can be said to be the audio which is to be listened to by the listener. Therefore, according to the above configuration, the determination of whether or not the audio is to be listened to by the listener is made based on the maximum reproduction sound pressure, and in a case that the audio is to be listened to by the listener, the audio can be reproduced by the optimal rendering scheme depending on a result of the determination.

In the audio signal processing device (audio signal processing unit 10) according to Aspect 8 of the present invention, in Aspect 1 described above, the processor (rendering scheme selecting unit 102) may select the one rendering scheme (rendering scheme A), for the audio signals of each of the at least one audio track or each of the split tracks, depending on a maximum reproduction sound pressure of the audio signal in a case that the maximum reproduction sound pressure is greater than a threshold (SplMaxB), and select the one rendering scheme, based on a distribution of the sound image locations assigned to the audio signals in a period from a track start to a track end in a case that the maximum reproduction sound pressure is equal to or lower than the threshold (SplMaxB).

In the audio signal processing device (audio signal processing unit 10) according to Aspect 9 of the present invention, in any of Aspects 1 to 8 described above, the plurality of rendering schemes may be configured to include a first rendering scheme in which the audio signals are output at a sound pressure ratio depending on a reproduction position from each of the plurality of audio output devices (speakers 601 and 602), and a second rendering scheme in which the audio signals subjected to processing depending on a reproduction position are output from each of the plurality of audio output devices.

In the audio signal processing device (audio signal processing unit 10) according to Aspect 10 of the present invention, in Aspect 9 described above, the first rendering scheme may be sound pressure panning and the second rendering scheme may be transaural.

In the audio signal processing device (audio signal processing unit 10) according to Aspect 11 of the present invention, in any of Aspects 1 to 10 described above, in a case that the plurality of audio output devices are in a form of an array speaker 605 in which a plurality of speaker units are arranged in a straight line at a constant interval, the plurality of rendering schemes include a wave field synthesis scheme.

An audio signal processing system (audio signal processing system 1) according to Aspect 12 of the present invention includes the audio signal processing device according to any of one of Aspects 1 to 11, and the plurality of audio output devices (speakers 601, 602, and 605).

The present invention is not limited to each of the above-described embodiments. It is possible to make various modifications within the scope of the claims. An embodiment obtained by appropriately combining technical elements each disclosed in different embodiments falls also within the technical scope of the present invention. Further, combining technical elements disclosed in the respective embodiments can form a new technical feature.

CROSS-REFERENCE OF RELATED APPLICATION

This application claims the benefit of priority to JP 2017-060025 filed on Mar. 24, 2017, which is incorporated herein by reference in its entirety.

REFERENCE SIGNS LIST

1 Audio signal processing system
10 Audio signal processing unit
20 Audio output unit
101 Content analyzing unit
102 Rendering scheme selecting unit
103 Audio signal rendering unit
104 Storage unit
201, 401 Track information
601, 602 Speaker
603, 604 Region
605 Array speaker
1001 Sound receiving area (specific receiving area)
1002 Audio track in sound receiving area (important track)
1003 Audio track out of sound receiving area (non-important track)

The invention claimed is:

1. An audio signal processing device for receiving an input of at least one audio track and performing a rendering process of calculating output signals to be output to a plurality of audio output devices, the audio signal processing device comprising:

a processor configured to select one rendering scheme among a plurality of rendering schemes for audio signals of each of the at least one audio track or split tracks of each of the at least one audio track, and perform rendering processing on the audio signals, wherein rendering processable ranges are defined in a plurality of the rendering schemes respectively, each of the rendering processable ranges being indicative of a range within which a sound image can be arranged, and the processor selects the one rendering scheme, based on a distribution of sound image locations assigned to the audio signals in a predetermined period and the rendering processable ranges.

2. The audio signal processing device according to claim 1, wherein the predetermined period is a period from a track start to a track end.

3. The audio signal processing device according to claim 1, wherein the processor selects the one rendering scheme for the audio signals of each of the at least one audio track or each of the split tracks, based on whether or not the sound image locations assigned to the audio signals are included in a sound receiving area configured in advance.

4. The audio signal processing device according to claim 3, wherein the sound receiving area is an area including a front of a listener.

5. The audio signal processing device according to claim 1, wherein accompanying information accompanying the audio signals includes information for indicating a type of an audio included in the audio signals, and the processor selects the one rendering scheme for the audio signals of each of the at least one audio track or each of the split tracks, based on whether or not the accompanying information accompanying the audio signals indicates that the audio signals include a dialogue or a narration.

6. The audio signal processing device according to claim 1, wherein accompanying information accompanying the audio signals includes information for indicating a type of an audio included in the audio signals, and the processor, for the audio signals of each of the at least one audio track or each of the split tracks, selects a rendering scheme having a lowest S/N ratio among the plurality of rendering schemes as the one rendering scheme in a case that the sound image locations assigned to the audio signals are included in a sound receiving area configured in advance, and that the accompanying information accompanying the audio signals indicates that the audio signals include a dialogue or a narration, and selects the one rendering scheme, based on a distribution of the sound image locations assigned to the audio signals in a period from a track start to a track end and the rendering processable ranges in other cases.

7. The audio signal processing device according to claim 1, wherein processor selects the one rendering scheme for the audio signals of each of the at least one audio track or each of the split tracks, based on a maximum reproduction sound pressure of the audio signals.

8. The audio signal processing device according to claim 1, wherein the processor selects the one rendering scheme for the audio signals of each of the at least one audio track or each of the split tracks, depending on a maximum reproduction sound pressure of the audio signals in a case that the maximum reproduction sound pressure is greater than a threshold, and selects the one rendering scheme, based on a distribution of the sound image locations assigned to the audio signals in a period from a track start to a track end and the rendering processable ranges in a case that the maximum reproduction sound pressure is equal to or lower than the threshold.

9. The audio signal processing device according to claim 1, wherein in a case that the plurality of audio output devices are in a form of an array speaker in which a plurality of speaker units are arranged in a straight line at a constant interval, the plurality of rendering schemes include a wave field synthesis scheme.

10. An audio signal processing device for receiving an input of at least one audio track and performing a rendering process of calculating output signals to be output to a plurality of audio output devices, the audio signal processing device comprising:

a processor configured to select one rendering scheme among a plurality of rendering schemes for audio signals of each of the at least one audio track or split tracks of each of the at least one audio track, and perform rendering processing on the audio signals, wherein:

rendering processable ranges are defined in a plurality of the rendering schemes respectively, each of the rendering processable ranges being indicative of a range within which a sound image can be arranged, the processor selects the one rendering scheme, based on sound image locations assigned to the audio signals and the rendering processable ranges, and the plurality of rendering schemes includes a first rendering scheme in which the audio signals are output at a sound pressure ratio depending on a reproduction position from each of the plurality of audio output devices, and a second rendering scheme in which the audio signals subjected to processing depending on a reproduction position are output from each of the plurality of audio output devices.

11. The audio signal processing device according to claim 10, wherein the first rendering scheme is sound pressure panning and the second rendering scheme is transaural.

12. An audio signal processing system comprising:

the audio signal processing device according to claim 1; and the plurality of audio output devices.

* * * * *